United States Patent
Hsu et al.

(10) Patent No.: US 7,075,348 B2
(45) Date of Patent: Jul. 11, 2006

(54) DIFFERENTIAL CHARGE PUMP WITH COMMON-MODE FEEDBACK COMPENSATION

(75) Inventors: Tse-Hsiang Hsu, Hsinchu (TW); Chih-Cheng Chen, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 10/270,597

(22) Filed: Oct. 16, 2002

(65) Prior Publication Data
US 2003/0107420 A1 Jun. 12, 2003

(30) Foreign Application Priority Data
Dec. 7, 2001 (TW) ............................... 90130456 A

(51) Int. Cl.
*H03L 7/093* (2006.01)
*H03F 3/45* (2006.01)

(52) U.S. Cl. .................. 327/157; 327/67; 330/259; 331/17

(58) Field of Classification Search .................. 327/54, 327/67, 157, 563; 330/258, 259; 331/16, 331/17
See application file for complete search history.

(56) References Cited

U.S. PATENT DOCUMENTS

| | | | |
|---|---|---|---|
| 6,107,859 A * | 8/2000 | Moyal | 330/258 |
| 6,181,210 B1 * | 1/2001 | Wakayama | 331/17 |
| 6,590,422 B1 * | 7/2001 | Dillon | 330/258 |
| 6,617,888 B1 * | 9/2003 | Volk | 327/67 |

* cited by examiner

*Primary Examiner*—Timothy P. Callahan
*Assistant Examiner*—Terry L. Englund
(74) *Attorney, Agent, or Firm*—Rabin & Berdo P.C.

(57) ABSTRACT

A differential charge pump includes a first current, a second current, a first switching device, a second switching device, a first phase inverting switching device, a second phase inverting switching device, and a common mode feedback device. The common mode feedback device is used to adjust the current level exported by the first current source, according to the common mode voltage of the differential charge pump, so that the respective currents exported by the first current source and the second current source are to be the same. The present invention has used the property that the common mode voltage of the differential charge pump should be a constant value, so as to correct the level of the current source. As a result, the current exported by the differential charge pump can be precisely corrected. Also, the present invention only needs one charge pump, so that the structure is simple and the fabrication is easy. In addition, no matter whether there is a rising or falling signal, the correction can be performed. Therefore, it has no issue of shift for the common mode voltage.

6 Claims, 4 Drawing Sheets

DIFFERENTIAL CHARGE PUMP WITH COMMON-MODE FEEDBACK COMPENSATION

This application incorporates by reference of Taiwan application Serial No. 090130456, filed Dec. 7, 2001.

BACKGROUND OF THE INVENTION

1. Field of the Invention

The present invention relates to a charge pump, and more particularly, the present invention relates to a differential charge pump capable of correction.

2. Description of Related Art

A phase lock loop (PLL) circuit is directed to a circuit system, which can produce a signal with the phase and frequency being fixed at a base. It has always been a difficult issue for the manufacturers to produce a phase lock loop circuit with low noise level and fast operation.

Referring to FIG. 1, it shows a circuit block diagram, schematically illustrating a conventional phase lock loop circuit 100. The phase lock loop circuit 100 includes a phase/frequency detector (PFD) 102, a loop filter (LP) 104, a voltage controlled oscillator (VCO) 106, and a frequency divider 108. The phase/frequency detector 102 can receive an input frequency $f_{IF}$ and a reference frequency $f_{ref}$ simultaneously. Also, according to a phase difference between the two frequencies, the phase/frequency detector 102 exports an output signal SI to the loop filter 104. The loop filter 104 is used to filter out the undesired noise and then export a signal SO, which is inputted to a VCO 106. The output frequency $f_{OF}$ outputted from the voltage control oscillator 106 is used as an output for the phase lock loop circuit 100. In addition, the output frequency $f_{OF}$ is further inputted to a frequency divider 108. The reference frequency $f_{ref}$ outputted by the frequency divider 108 is equal to an output frequency $f_{OF}$ divided by a positive integer N, in which the quantity of N is determined by the control signal $f_{CO}$ that is inputted to the frequency divider 108.

After the phase lock loop circuit 100 is activated and after a settle time period, the phase lock loop circuit 100 then enters a phase lock state. At this moment, the reference frequency $f_{ref}$ is equal to the input frequency $f_{IF}$, and the output frequency $f_{OF}$ then is equal to $N \times f_{ref}$.

A post stage circuit of the phase/frequency detector 102 is a charge pump circuit. Referring to FIG. 2, it shows a circuit diagram, schematically illustrating a conventional charge pump circuit. The charge pump circuit 200 is composed of two current sources $I_{UP}$ and $I_{DN}$, and a number of switching devices S1, S2, S1', and S2'. The node connecting the switching devices S1' and S2' is coupled to a reference VR. When the switching device S1 receives a rising signal fp from the previous stage of the circuit (that is the ON state), it will cause the charge pump 200 to export a rising current. When the switching device S2 receives a falling signal fd from the previous stage of the circuit, it will cause the charge pump 200 to export a falling current. The state of the switching device S1' is the inverse of the state of the switching device S1, and the state of the switching device S2' is the inverse of the state of the switching device S2. When the switching devices S1 and S2 are both in an open circuit, which is the OFF state, the switching devices S1' and S2' are at the ON state, so as to prevent the current source $I_{UP}$ and $I_{DN}$ from floating. The rising signal fp and the falling signal fd are determined according to the phase difference between the reference frequency $f_{ref}$ and the input frequency $f_{IF}$.

Theoretically, the charge pump has two current sources $I_{UP}$ and $I_{DN}$, of which the physical properties of the circuit elements are the same. In other words, the current level exported by the current source $I_{UP}$ and the current level exported by the current source $I_{DN}$ are the same. However, in the practical situation, the two current sources may not be the same due to errors in the fabrication process or the differences in the properties of the circuit elements. For these reasons, when the charge pump 200 receives the same rising and falling signals fp and fd, the actual levels of current outputted are not the same. At this moment, even if the phases between the reference frequency $f_{ref}$ and the input frequency $f_{IF}$ are the same, the phase current Io exported from the charge pump is not zero. In this situation, the effect of phase lock for the phase lock loop circuit would worsen.

Conventionally, correction of this error in the charge pump is done by various methods. For further description, the conventional differential charge pump is taken as an example. Referring to FIG. 3, it shows a circuit diagram, schematically illustrating the conventional differential charge pump 300. The differential charge pump 300 includes a first charge pump 310, a second charge pump 320, and a common mode feedback device CMP, so as to export a current to cause the capacitor C to charge or discharge, where the capacitor C is a front stage of circuit in the loop filter 104. The first charge pump 310 includes a current source $I_{UP1}$, a current source $I_{DN1}$, and a number of switching devices S1, S2, S1', and S2', in which the coupling relation is as shown in FIG. 3. The switching device S1 is controlled by the rising signal fp; the switching device S2 is controlled by the falling signal fd; and the switching device S1' and the switching device S2' are respectively inverse to the switching device S1 and the switching device S2. The node A is the output terminal of the first charge pump 310, and the node A' is the terminal for receiving a first reference voltage VR1. The second charge pump 320 includes a current source $I_{UP2}$, a current source $I_{DN2}$, and a number of switching devices S3, S4, S3', and S4', in which the coupling relation is as shown in FIG. 3. The switching device S4 is controlled by the rising signal fp; the switching device S3 is controlled by the falling signal fd; and the switching device S3' and the switching device S4' are respectively inverse to the switching device S3 and the switching device S4. The node B is the output terminal of the second charge pump 320, and the node B' is the terminal for receiving the first reference voltage VR1. The two terminals of the capacitor C are electrically coupled with the node A and node B respectively.

When the differential charge pump 300 receives the rising signal fp, the switching device S1 and the switching device S4 are conducted to each other. The current exported by the charge pump 300 flows through the capacitor C via the switching device S1 and the node A, and also through the switching device S4 and the current source $I_{DN2}$, so as to charge the capacitor C. When the differential charge pump 300 receives the falling signal fd, the switching device S2 and the switching device S3 are conducted to each other. The current exported by the charge pump 300 flows through the capacitor C via the switching device S3 and the node B, and also through the node A, the switching device S2, and the current source $I_{DN1}$, so as to discharge the capacitor C. The averaged voltage for the nodes A and B is the common mode voltage. The common mode feedback device CMP is used to receive the voltages from the node A and the node B as well as the second reference voltage VR2, and to compare the averaged voltage between the node A and node B with the second reference voltage VR2, so as to accordingly export an adjusting signal Vf for adjusting the quantities of the current sources $I_{UP1}$ and $I_{UP2}$. The differential charge pump has the following disadvantages:

1. Since it includes two sets of charge pumps, the circuitry is very complicated.
2. It can only assure that $I_{UP1}+I_{UP2}=I_{DN1}+I_{DN2}$. It cannot assure that $I_{UP1}=I_{UP2}$ and $I_{DN1}=I_{DN2}$.
3. When the differential charge pump 300 is idle for a long period (that is, the switching device S1, S2, S3, and S4 are all in open circuit) the capacitor C is floating and the common mode voltage would likely shift.

SUMMARY OF THE INVENTION

It is therefore an objective of the present invention to provide a charge pump capable of correction.

In accordance with the foregoing and other objectives of the present invention, a differential charge pump is provided, including a first current, a second current, a first switching device, a second switching device, a first phase inverting switching device, a second phase inverting switching device, and a common mode feedback device. The first current source is used to provide a first current according to an adjusting signal. The second current source is used to provide a second current. A first terminal of the first switching device is coupled with the first current source, and their conducting state is based on the rising signal. A terminal of the second switching device is coupled with another terminal of the first switching device at a first node, and the other terminal of the second switching device is coupled to the second current source, in which the conducting state is based on the falling signal. One terminal of the first phase inverting switching device is coupled with the first current source and the conducting state is inverse to that of the first switching device. One terminal of the second phase inverting switching device is coupled with the first phase inverting switching device at the second node, and the other terminal is coupled with the second current source, of which the conducting state is inverse to that of the second switching device. The common mode feedback device is used to receive the reference voltage, the voltage of the first node, and the voltage of the second node, and to export an adjusting signal accordingly. The averaged voltage of the first and second node voltages is the common mode voltage, which is a constant value. In other words, the common mode feedback device adjusts the current output of the current source according to those properties.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
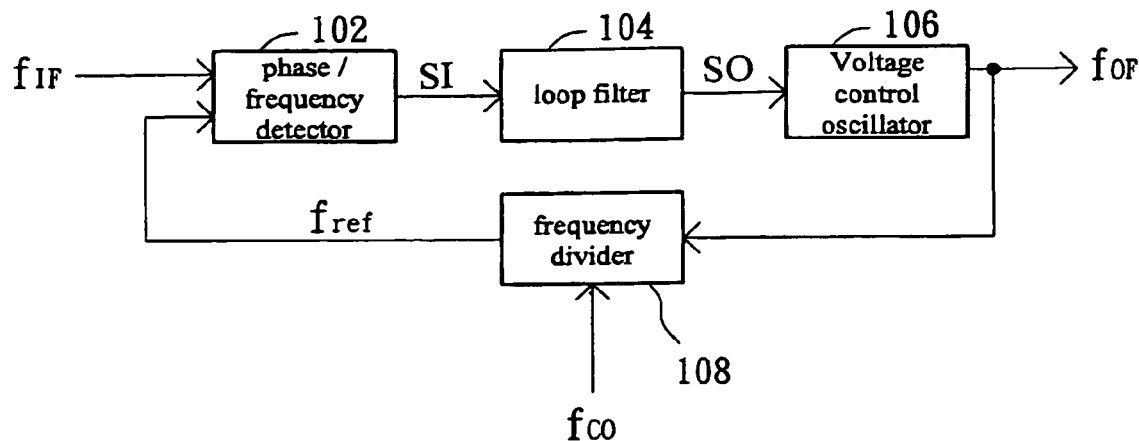
FIG. 1 is a drawing of a circuit block diagram, schematically illustrating a conventional phase lock loop circuit.
Figure 2:
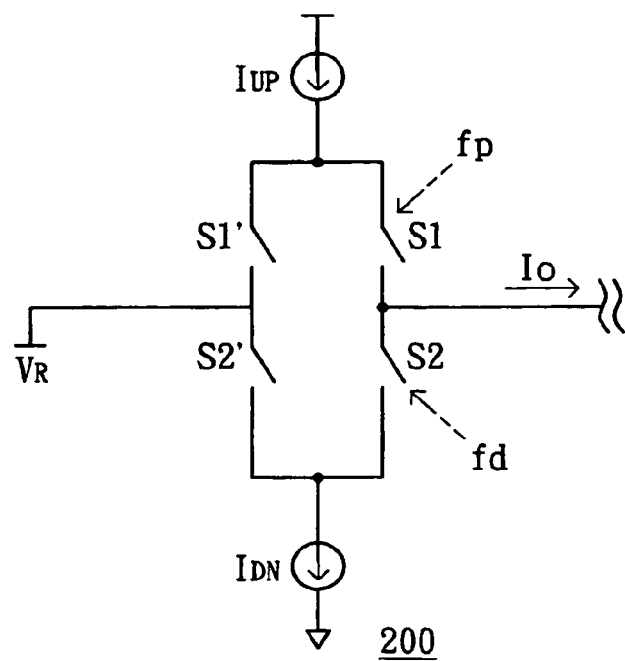
FIG. 2 is a drawing of a circuit diagram, schematically illustrating a conventional charge pump circuit.
Figure 3:
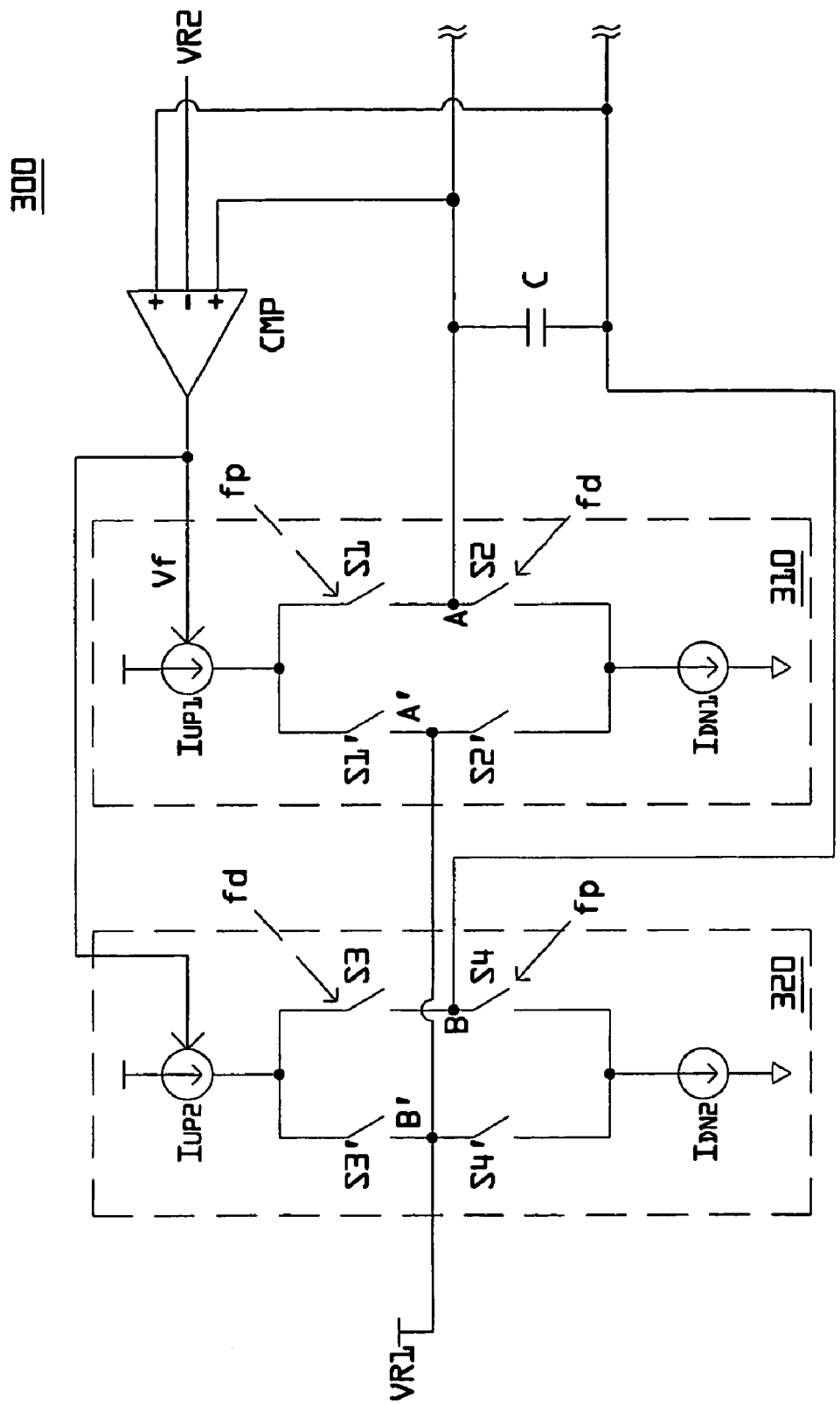
FIG. 3 is a drawing of a circuit diagram, schematically illustrating the conventional differential charge pump.
Figure 4:
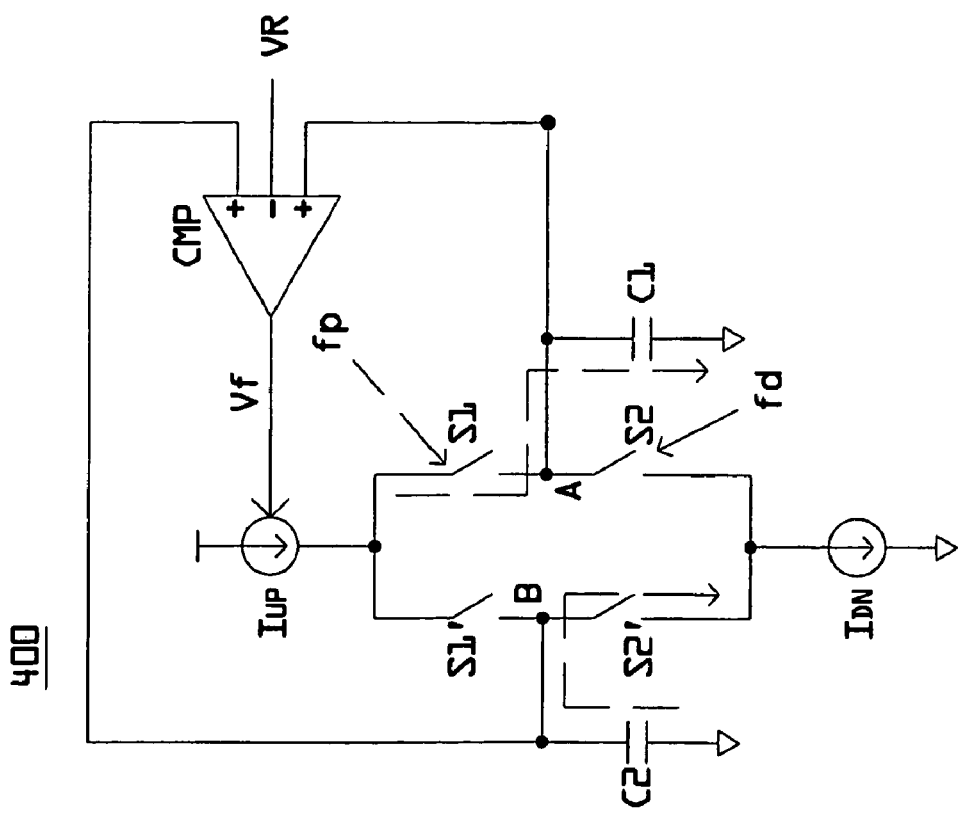
FIG. 4 is a drawing of a circuit diagram, schematically illustrating a differential charge pump, according to a preferred embodiment of the present invention.

The feature of the present invention is to use the common mode voltage of the differential charge pump, which should be a constant value, for adjusting the quantity of the output current exported by the current source. Referring to FIG. 4, it shows a circuit diagram, schematically illustrating a differential charge pump 400 according to a preferred embodiment of the present invention. The differential charge pump 400 includes a current source $I_{up}$ and a current source $I_{DN}$, a switching device S1, a switching device S2, a phase inverting switching device S1', a phase inverting switching device S2', and the common mode feedback device CMP, used to charge or discharge the capacitor C1 and the capacitor C2. Wherein, the differential charge pump 400 is a post stage in the phase/frequency detector 102 of the phase lock loop circuit 100, and the capacitor C1 and capacitor C2 are the front stage of the loop filter 104 shown in FIG. 1. One terminal of the switching device S1 is coupled with the current source $I_{UP}$, in which the switching device S1 is conducted to an ON state when a rising signal fp is received. Another terminal of the switching device S2 and another terminal of the switching device S1 are coupled to the node A, in which another terminal of the switching device S2 is coupled with the current source $I_{DN}$, and the switching device S2 is conducted to the ON state when a falling signal fd is received. One terminal of the phase inverting switching device S2' is coupled with the phase inverting switching device S1' at the node B, and another terminal is coupled with the current source $I_{DN}$ having an inverse state of the switching device S2. The common mode feedback device CMP is used to receive the reference voltage VR, the voltage of the node A, and the voltage of the node B, so as to accordingly export the adjusting signal Vf for adjusting the current exported by the current source $I_{UP}$. Wherein, the averaged voltage of the node A and the node B is the common mode voltage.

Referring to FIG. 4 again, when the charge pump 400 receives the rising signal fp, the current flows along the route of the dotted line. At this moment, the switching devices S1 and S2' are conducted. The current source IUP will export the current to charge the capacitor C1. At the same time, the current source IDN will export the current to discharge the capacitor C2. If the respective current outputs of the current source IUP and the current source IDN are the same, then the amount of charges being charged to the capacitor C1 will be equal to the amount of charges being discharged from the capacitor C2. This means that a sum of the voltages at the node A and the node B remains the same. If the sum of the voltages at the node A and the node B increases, it indicates that the amount of charges being charged is greater than the amount of charges being discharged, meaning that the current exported by the current source IUP is greater than the current exported by the current source IDN. As a result, the common mode feedback device CMP can accordingly export an adjusting signal Vf to decrease the current output from the source IUP. If the sum of voltages on the node A and the node B becomes smaller, this indicates that the amount of charge being discharged is greater than the charges being charged, meaning that the current exported by the current source IUP is less than the current exported by the current source IDN. As a result, the common mode feedback device CMP can accordingly export an adjusting signal Vf to increase the current output from the source IUP. By the same principle, when the charge pump 400 receives the falling signal fd, the charge pump can maintain the same current levels exported by the current sources IUP and IDN. In addition, when the rising signal fp and the falling signal fd are present at the same time, or when the rising signal fp and the falling signal fd are absent at the same time, the action of correction can operate in the normal working manner. Therefore, no matter what combination of rising signal fp and falling signal fd occurs, the action of correction for the current source can be performed. In addition, no matter what combination of rising signal fp and falling signal fd occurs, the current source IUP and IDN will not be floating.

Figure 5:
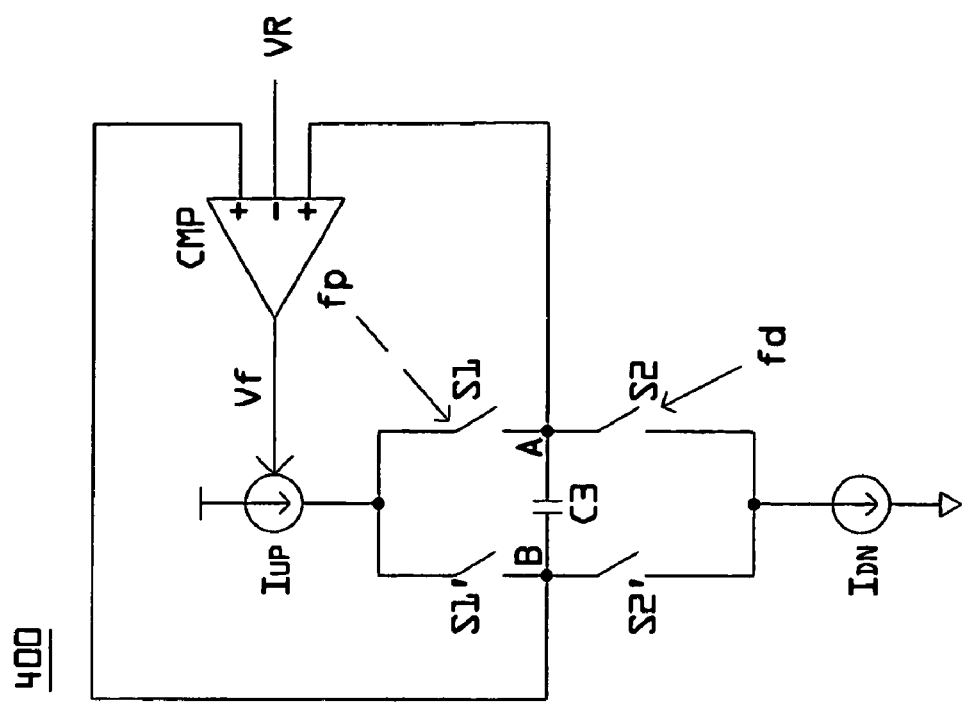
FIG. 5 is a drawing of a circuit diagram, schematically illustrating another application using the differential charge pump in FIG. 4, according to the preferred embodiment of the present invention.

Referring to FIG. 5, it shows another application of the differential charge pump 400, but with the capacitor C3 replacing the capacitors C1 and C2 of FIG. 4. When the rising signal is received, the switching device S1 and the switching device S2' are conducted. The current flows from the node A to the node B, so as to charge the capacitor C3. When the falling signal is received, the current flows from the node B to the node A, so as to discharge the capacitor C3. The common mode feedback device CMP then exports an adjusting signal Vf to adjust the current source $I_{UP}$ according to the sum of the voltages at the terminals of the capacitor C3 and the reference voltage VR.

Figure 7:
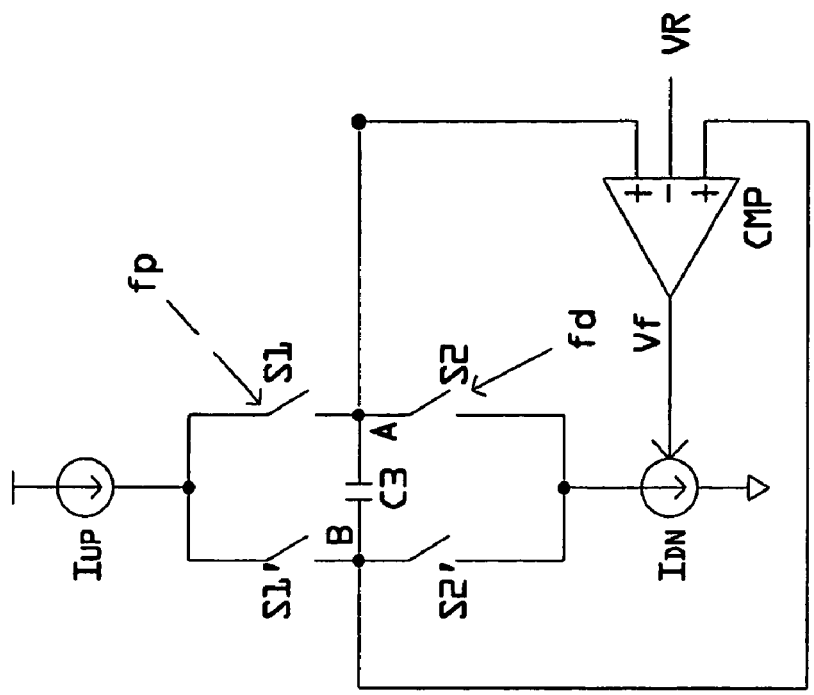
FIG. 7 is a drawing of a circuit diagram, schematically illustrating another application using the differential charge pump in FIG. 6, according to a preferred embodiment of the present invention.
Figure 6:
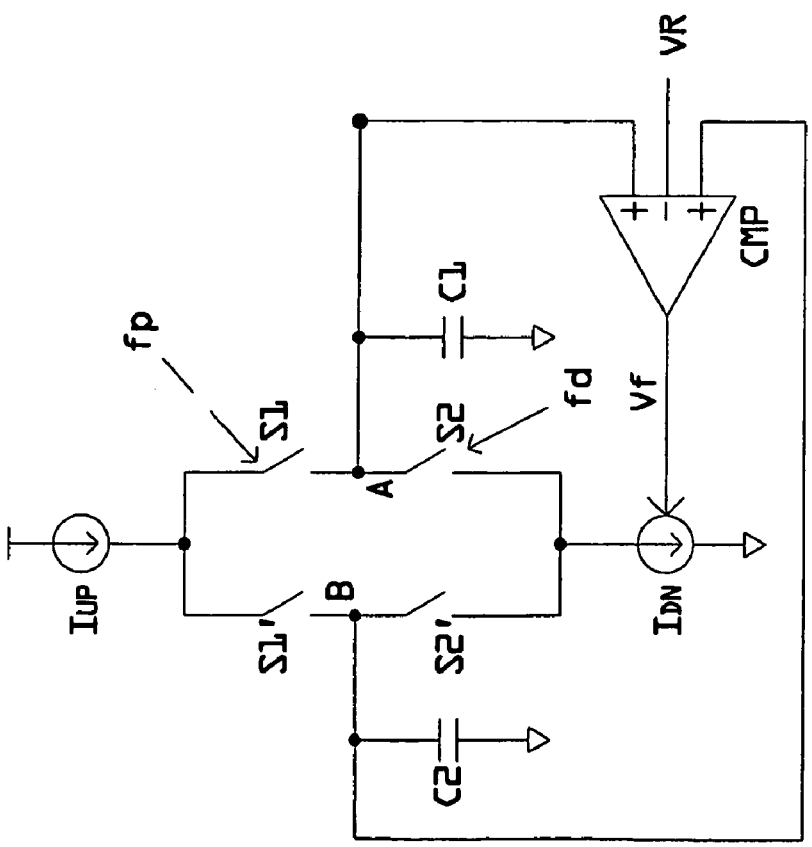
FIG. 6 is a drawing of a circuit diagram, schematically illustrating a differential charge pump, according to another preferred embodiment of the present invention.

The embodiments as shown in FIG. 4 and FIG. 5 have the objective to adjust the current source $I_{up}$. However, they can also be aimed to adjust the current source $I_{DN}$. The operation principle is similar to the foregoing embodiments. The only change is the adjusting signal Vf, exported by the common mode feedback device CMP into the current $I_{DN}$, and thus, the level of current source $I_{DN}$ can be changed, according to an averaged voltage of the voltages at the node A and the node B. Referring to FIG. 6, it shows a circuit diagram, schematically illustrating a differential charge pump 600, according to another preferred embodiment of the present invention. The difference between the differential charge pump 600 and the differential charge pump 400 in FIG. 4 is that the adjusting signal exported by the common mode feedback device CMP is fed to the current source $I_{DN}$ but not the current source $I_{up}$. When the sum of the voltages on the node A and the node B is greater than the reference voltage VR, the adjusting signal is used to increase the current exported by the current source $I_{DN}$. When the sum of the voltages on the node A and the node B is less than the reference voltage VR, the adjusting signal is used to decrease the current exported by the current source $I_{DN}$. Referring to FIG. 7, it shows a circuit diagram, schematically illustrating another application using the differential charge pump 600 in FIG. 6, according to the preferred embodiment of the present invention, wherein the capacitor C3 in FIG. 7 replaces the capacitors C1 and C2 in FIG. 6. When the rising signal is received, the switching device S1 and the switching device S2' are conducted. In this situation, the current flows from the node A to the node B, so as to charge the capacitor C3. When the falling signal is received, the current flows from the node B to the node A, so as to discharge the capacitor C3. The common mode feedback device CMP exports an adjusting signal Vf to adjust the level of the current source $I_{DN}$, according to the sum of the voltages at both terminals of the capacitor C3 and the reference voltage VR.

The application of the differential charge pump of the present invention is wide. The foregoing embodiments are only example applications of the phase lock loop circuit and are not restrictive.

In conclusion, the foregoing embodiments of the present invention have disclosed the differential charge pump with the following advantages:

1. The present invention uses the feature that the common mode voltage in the differential charge pump should be constant, so as to adjust the level of the current source and precisely correct the current exported by the differential charge pump.

2. The present invention only needs to use one set of charge pump. The architecture is much simpler and the fabrication will be much easier.

3. No matter whether there is a rising or falling signal, the correction can always be performed. As a result, the occurrence of shift in the common mode voltage will be prevented.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A differential charge pump, comprising:
    a first current source, used to provide a first current according to an adjusting signal;
    a second current source, used to provide a second current;
    a first switching device, wherein a first terminal of the first switching device is coupled with the first current source, and a conducting state of the first switching device is based on presence of a pump-up signal for conducting;
    a second switching device, wherein a terminal of the second switching device is coupled with another terminal of the first switching device at a first node, and another terminal of the second switching device is coupled with the second current source, in which a conducting state of the second switching device is based on presence of a pump-down signal for conducting;
    a first phase inverting switching device, wherein one terminal of the first phase inverting switching device is coupled with the first current source and a conducting state of the first phase inverting switching device is inverse to the first switching device;
    a second phase inverting switching device, wherein one terminal of the second phase inverting switching device is coupled with the first phase inverting switching device at a second node, and another terminal of the second phase inverting switching device is coupled with the second current source, in which a conducting state of the second phase inverting switching device is inverse to the second switching device;
    a common mode feedback device, used to receive a reference voltage, a voltage of the first node, and a voltage of the second node, and to export the adjusting signal accordingly;

a first capacitor, one terminal of the first capacitor being coupled to the first node, and the other terminal of the first capacitor being coupled to a ground voltage; and a second capacitor, one terminal of the second capacitor being coupled to the second node, and the other terminal of the second capacitor being coupled to the ground voltage, wherein output of the differential charge pump is taken between the first node and the second node, wherein a common mode voltage is an average of the voltage of the first node and the voltage of the second node, and wherein when the pump-up signal and the pump-down signal are present at the same time, the first switching device and the second switching device are both conducting and the adjusting signal is exported by the common mode feedback device, and when the pump-up signal and the pump-down signal are absent at the same time, the first phase inverting switching device and the second phase inverting switching device are conducting and the adjusting signal is also exported by the common mode feedback device, such that no matter what combination of pump-up signal and pump-down signal occurs, adjustment of the first current source is always performed, the first and second current sources are not floating, and the occurrence of a shift in the common mode voltage is prevented.

2. The differential charge pump as recited in claim 1, wherein the differential charge pump is used as a post stage circuit of a phase/frequency detector in a phase lock loop circuit, and the first capacitor and the second capacitor are a front stage of a loop filter in the phase lock loop circuit.

3. The differential charge pump as recited in claim 1, wherein when the common mode voltage is greater than the reference voltage, the adjusting signal is used to decrease the first current, and when the common mode voltage is less than the reference voltage, then the adjusting signal is used to increase the first current.

4. A differential charge pump, comprising:
a first current source, used to provide a first current source;
a second current source, used to provide a second current according to an adjusting signal;
a first switching device, wherein a first terminal of the first switching device is coupled with the first current source, and a conducting state of the first switching device is based on presence of a pump-up signal for conducting;
a second switching device, wherein a terminal of the second switching device is coupled with another terminal of the first switching device at a first node, and another terminal of the second switching device is coupled with the second current source, in which a conducting state of the second switching device is based on presence of a pump-down signal for conducting;
a first phase inverting switching device, wherein one terminal of the first phase inverting switching device is coupled with the first current source and a conducting state of the first phase inverting switching device is inverse to the first switching device;
a second phase inverting switching device, wherein one terminal of the second phase inverting switching device is coupled with the first phase inverting switching device at a second node, and another terminal of the second phase inverting switching device is coupled with the second current source, in which a conducting state of the second phase inverting switching device is inverse to the second switching device;
a common mode feedback device, used to receive a reference voltage, a voltage of the first node, and a voltage of the second node, and to export the adjusting signal accordingly;
a first capacitor, one terminal of the first capacitor being coupled to the first node, and the other terminal of the first capacitor being coupled to a ground voltage; and
a second capacitor, one terminal of the second capacitor being coupled to the second node, and the other terminal of the second capacitor being coupled to the ground voltage,
wherein output of the differential charge pump is taken between the first node and the second node,
wherein a common mode voltage is an average of the voltage of the first node and the voltage of the second node, and
and wherein when the pump-up signal and the pump-down signal are present at the same time, the first switching device and the second switching device are both conducting and the adjusting signal is exported by the common mode feedback device, and when the pump-up signal and the pump-down signal are absent at the same time, the first phase inverting switching device and the second phase inverting switching device are conducting and the adjusting signal is also exported by the common mode feedback device, such that no matter what combination of pump-up signal and pump-down signal occurs, adjustment of the second current source is always performed, the first and second current sources are not floating, and the occurrence of a shift in the common mode voltage is prevented.

5. The differential charge pump as recited in claim 4 wherein the differential charge pump is used as a post stage circuit of a phase/frequency detector in a phase lock loop circuit, and the first capacitor and the second capacitor are a front stage of a loop filter in the phase lock loop circuit.

6. The differential charge pump as recited in claim 4 wherein when the common mode voltage is greater than the reference voltage, the adjusting signal is used to increase the second current, and when the common mode voltage is less than the reference voltage, the adjusting signal is used to decrease the second current.

* * * * *